United States Patent [19]

Liu

[11] Patent Number: 4,670,668
[45] Date of Patent: Jun. 2, 1987

[54] SUBSTRATE BIAS GENERATOR WITH POWER SUPPLY CONTROL MEANS TO SEQUENCE APPLICATION OF BIAS AND POWER TO PREVENT CMOS SCR LATCH-UP

[75] Inventor: Wei-Ti Liu, San Jose, Calif.

[73] Assignee: Advanced Micro Devices, Inc., Sunnyvale, Calif.

[21] Appl. No.: 732,529

[22] Filed: May 9, 1985

[51] Int. Cl.⁴ ............................................. H03K 3/353
[52] U.S. Cl. ............................ 307/296 R; 307/200 B; 307/297; 307/592; 307/594
[58] Field of Search ................... 307/200 B, 355, 579, 307/585, 591, 592, 594, 296 R, 297

[56] References Cited

U.S. PATENT DOCUMENTS

| | | | |
|---|---|---|---|
| 4,039,869 | 8/1977 | Goldman et al. | 307/579 X |
| 4,151,425 | 4/1979 | Cappa | 307/297 X |
| 4,233,672 | 11/1980 | Suzuki et al. | 307/296 R X |
| 4,281,260 | 7/1981 | Moegen et al. | 307/296 R X |
| 4,300,061 | 11/1981 | Mihalich et al. | 307/297 |
| 4,463,270 | 7/1984 | Gordon | 307/296 R |
| 4,473,758 | 9/1984 | Huntington | 307/296 R |
| 4,549,096 | 10/1985 | Hoffmann | 307/297 |
| 4,571,505 | 2/1986 | Eaton, Jr. | 307/296 R X |

FOREIGN PATENT DOCUMENTS 58-2061 7/1983 Japan ............................ 307/296 R Primary Examiner—Stanley D. Miller
Assistant Examiner—D. R. Hudspeth
Attorney, Agent, or Firm—Patrick T. King; Davis Chin

[57] ABSTRACT

A bias generator circuit includes a first high voltage for biasing a N-well region and a second delayed and lower voltage biasing a source region of a P-channel field-effect transistor so as to increase latch-up immunity. The generator circuit includes a high voltage generator and a multiplier circuit responsive to a power supply voltage for generating a first voltage level for biasing the N-well region. A delay network is responsive to the first voltage for generating a delay voltage. A level detection circuit is responsive to the delay voltage and the power supply voltage for generating a control signal when the delayed voltage reaches a predetermined level. A control device is responsive to the control signal for generating a second voltage for biasing the source region of the P-channel field-effect transistor. The second voltage level is delayed and lower than the first voltage level so that the PN junction is reverse biased to increase latch-up immunity.

17 Claims, 10 Drawing Figures

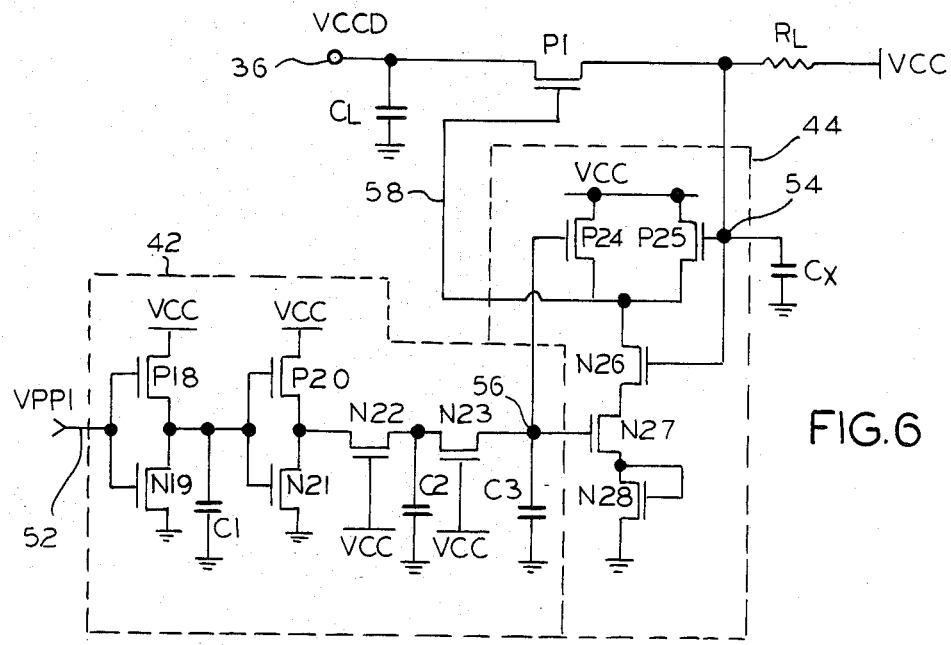
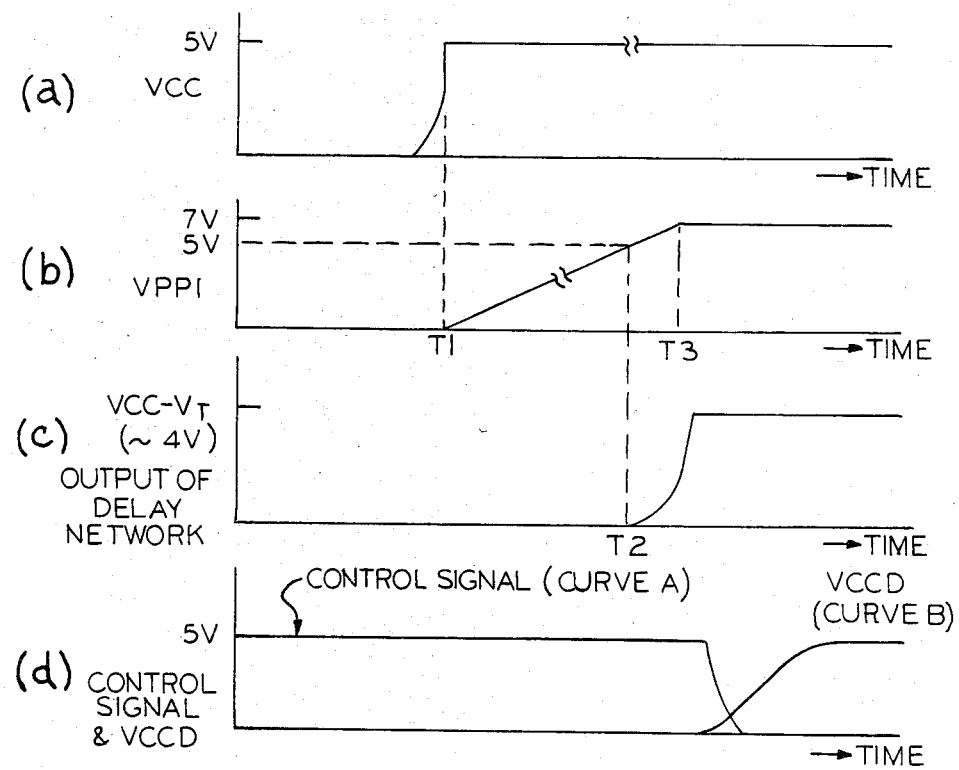
FIG. 6
FIG. 7

SUBSTRATE BIAS GENERATOR WITH POWER SUPPLY CONTROL MEANS TO SEQUENCE APPLICATION OF BIAS AND POWER TO PREVENT CMOS SCR LATCH-UP

BACKGROUND OF THE INVENTION

This invention relates generally to bias generator circuits and more particularly, it relates to a bias generator circuit which produces a first higher voltage for biasing a N-well region and a second delayed and lower voltage for biasing a source region of a P-channel field-effect transistor so as to increase latch-up immunity.

There is shown in FIG. 1 a cross-sectional view of a portion of an integrated circuit 10 containing a P-channel field-effect transistor (FET). The field-effect transistor is formed of a P-conductivity type regions 12 and 14 which are diffused in a N-conductivity type well 16. The N-well region 16 is formed in or on a P-conductivity type substrate 18. The P-type region 12 is defined to be the source electrode and the P-type region 14 is defined to be the drain electrode. The source and drain electrodes form the ends of a conduction channel. Overlying the space between the source and drain regions is an insulator layer 21 such as silicon dioxide over which is formed a gate electrode 22. Further, a N-type region 24 is also formed in the N-well region 16 in a laterally spaced apart relationship to the P-type region 14. The N-well region 16 and the P-type region 12 form a PN junction and are both tied to a common supply voltage or potential VCC.

In order to prevent the forward bias (referred to as CMOS SCR latch-up) of the PN junction between the diffused source region 12 and the N-well region 16, there has been attempted in the prior art of generating two separate supply voltages in which a first higher voltage VCC1 or $V_{nw}$ is used to bias the N-well region 16 and a second lower voltage VCC2 is used for biasing the source region 12 of the P-channel transistor. This arrangement is illustrated in FIG. 2 of the drawings. However, this arrangement suffers from the problem of a racing condition which exists between the higher voltage VCC1 applied to the N-well region and lower voltage VCC2 applied to the source region. Due to the resistivity of the N-well region 16 shown as resistors RW1 and RW2, the higher voltage VCC1 will have a larger RC time delay in reaching voltage point VW2 than the lower voltage VCC2. Thus, if the second voltage VCC2 is greater than the voltage VW2 by 0.65 volts, the PN junction would be forward bias, thereby still causing CMOS SCR latch-up to occur. The time delay of voltage VW2 relative to the first voltage VCC1 is depicted in FIG. 2(b).

The present invention provides a means of generating a first voltage for biasing a N-well region which is higher and occurs prior to a second voltage for biasing a source region of a P-channel transistor so as to insure preventing of latch-up from occurring during a power-up sequence. This is accomplished by the instant bias generator circuit which delays supplying of the second voltage until the first voltage has been pumped up to a level in excess of power supply voltage.

SUMMARY OF THE INVENTION

Accordingly, it is a general object of the present invention to provide a bias generator circuit which produces a first higher voltage for biasing a N-well region and a second delay and lower voltage for biasing a source region of a P-channel field-effect transistor so as to increase latch-up immunity.

It is an object of the present invention to provide a bias generator circuit which includes a high voltage generator and a multiplier circuit for generating a first higher voltage level for biasing a N-well region.

It is another object of the present invention to provide a bias generator circuit which includes a delay network, a level detector circuit and a control device for generating a second delayed and lower voltage for biasing a source region of a P-channel field-effect transistor.

It is still another object of the present invention to provide a bias generator circuit formed of a high voltage generator, a multiplier circuit, a delay network, a level detection circuit, and a control device for generating a first higher voltage level for biasing a N-well region and for generating a second delayed and lower voltage for biasing a source region of a P-channel field-effect transistor.

It is yet still another object of the present invention to provide a bias generator circuit formed on a single silicon chip of a semiconductor integrated circuit for generating a first higher voltage for biasing a N-well region and a second delayed and lower voltage for biasing a source region of a P-channel field-effect transistor.

In accordance with these aims and objectives, the present invention is concerned with the provision of a bias generator circuit which includes a high voltage generator and a multiplier circuit responsive to a power supply voltage for generating a first voltage for biasing a N-well region. A delay network is responsive to the first voltage for generating a delay voltage. A level detection circuit is responsive to the delay voltage and power supply voltage for generating a control signal when the delayed voltage reaches a predetermined level. A control device is responsive to the control voltage for generating a second voltage for biasing a source region of a P-channel field-effect transistor. The second voltage is delayed and lower than the first voltage so that the PN junction is reverse biased to increase latch-up immunity.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 6 is a schematic circuit diagram of the delay network and level detection circuit of FIG. 3; and FIGS. 7, 8 and 9 are waveform diagrams useful for understanding the operation of the circuits in FIGS. 3 through 6.

DESCRIPTION OF THE PREFERRED EMBODIMENT

Figure 1:
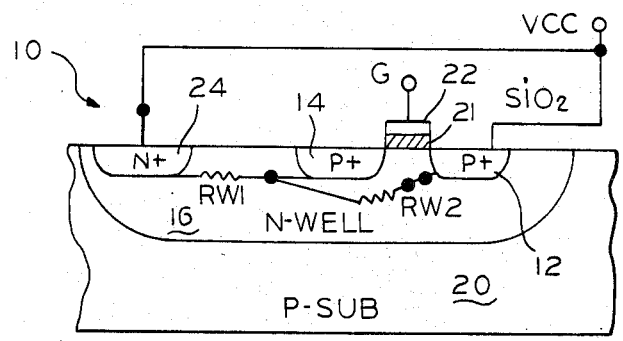
FIG. 1 is a cross-sectional view of a portion of an integrated circuit containing a P-channel field-effect transistor which has a common supply potential.
Figure 2A:
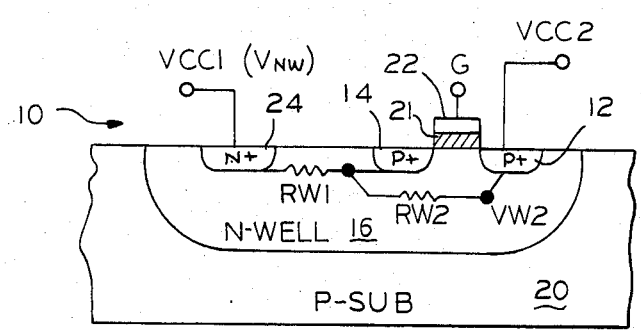
FIG. 2(a) is a cross-sectional view of a portion of an integrated circuit containing a P-channel field-effect transistor which has two separate supply voltages.
Figure 2B:
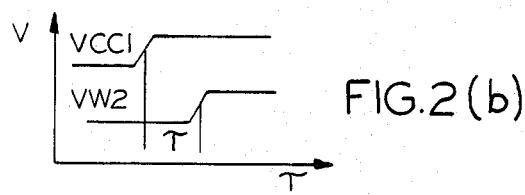
FIG. 2(b) is a waveform which illustrates the time delay of the voltage VW2 relative to the voltage VCC1.
Figure 3:
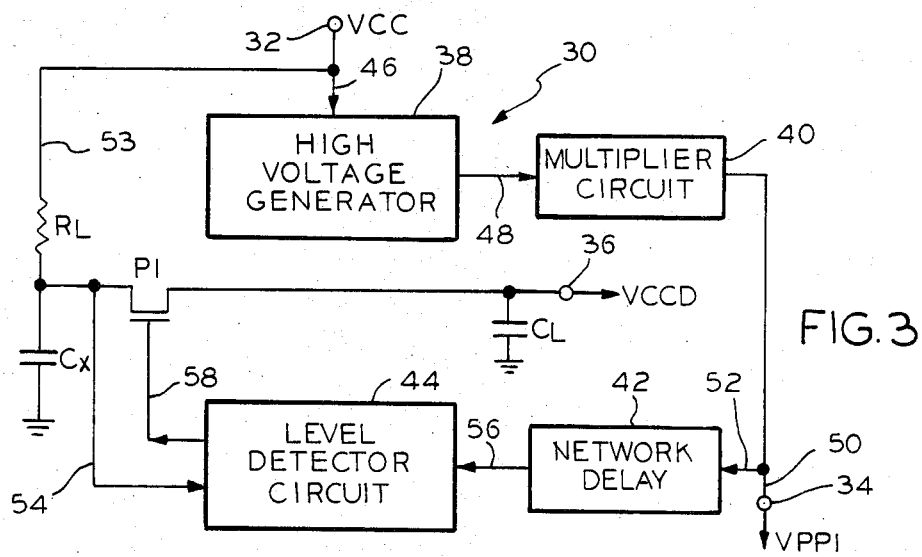
FIG. 3 is a circuit schematic, partly in block diagram form, of a bias generator circuit, according to the present invention.

Referring now in detail to the drawings, there is shown in FIG. 3, a circuit schematic, partly in block diagram form, of a bias generator circuit 30 embodying the principles of the present invention. The bias generator circuit 30 receives a power supply voltage or potential VCC at its input via input terminal 32 during a "power-up" sequence. The "power-up" function is to deliver the power supply voltage to MOS transistor circuits only when they are required to be active, thereby reducing power consumption of the circuits when they are inactive. In response to the supply potential VCC being applied to the bias generator circuit 30, two different voltages VPP1 and VCCD are generated in sequence. The voltage VPP1 is defined as a first higher voltage which is to be applied to the N-well region 16 of FIG. 2(a) and is the same as the supply voltage VCC1. The voltage VCCD is defined as a second delayed and lower voltage which is to be applied to source region 12 of FIG. 2(a) and is the same as the supply voltage VCC2.

The first voltage VPP1 is generated at a first output terminal 34 prior to the supplying of the second voltage VCCD at a second output terminal 36. Further, the first voltage VPPI must also be higher than the supply voltage VCC before the second voltage VCCD is delivered to the output terminal 36. As a result, the second voltage VCCD applied to the source region will always be delayed and lower than the first voltage VPP1 applied to the N-well region. Consequently, this ensures that the PN junction will be reversed biased so as to prevent CMOS SCR latch-up.

The bias generator circuit 30 includes a high voltage generator 38, a multiplier circuit 40, a delay network 42 and a level detector circuit 44. The high voltage generator 38 has its input connected to the supply potential VCC via a lead line 46. The multiplier circuit 40 has its input connected to the output of the high voltage generator 38 via lead line 48. The output of the multiplier circuit 40 is fed to the first output terminal 34 via line 50 for supplying the first voltage VPP1 and to the input of the delay network 42 via line 52.

A delay circuit is formed of a resistor $R_L$ and a capacitor $C_X$. One end of the resistor $R_L$ is connected via line 53 to the supply potential VCC and its other end is connected to one end of the capacitor $C_X$. The other end of the capacitor $C_X$ is connected to a ground potential. The junction of the resistor $R_L$ and the capacitor $C_X$ defines a first input to the level detector circuit 44 and is connected thereto via line 54. The second input to the level detector circuit 44 is from the output of the delay network 42 via line 56. The junction of the resistor $R_L$ and the capacitor $C_X$ is also coupled to the source electrode of a P-channel metal-oxide semiconductor (MOS) transistor P1 defining a control means. The output of the detector circuit 44 on line 58 is applied to the gate electrode of the transistor P1. The drain electrode of the transistor P1 is tied to one end of a load capacitor $C_L$ and to the second output terminal 36 for supplying the second voltage VCCD.

Figure 4:
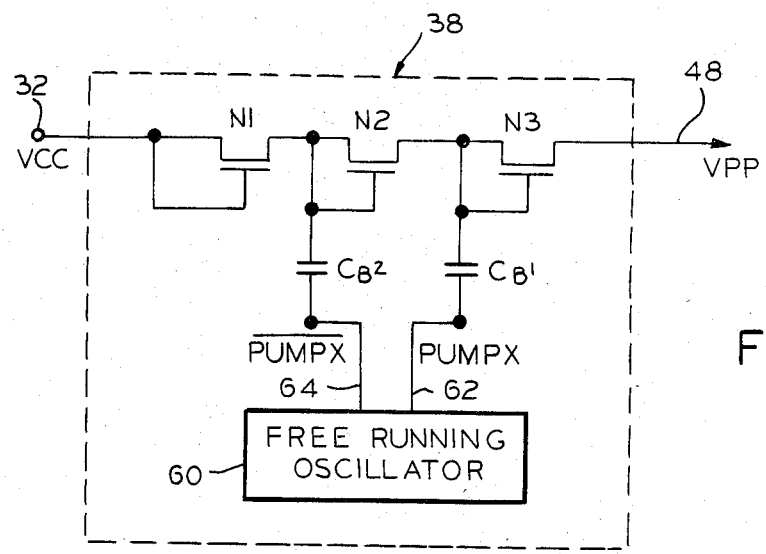
FIG. 4 is a schematic circuit diagram of the high voltage generator of FIG. 3.

A detailed schematic circuit diagram of the high voltage generator 38 is illustrated in FIG. 4. The high voltage generator 38 is quite conventional for pumping the supply potential VCC to a higher output voltage VPP on the line 48. The generator 38 is formed of N-channel MOS transistors N1, N2 and N3, a pair of capacitors $C_{B1}, C_{B2}$, and a free-running oscillator 60. The power supply potential VCC is applied to the drain and gate electrodes of the transistor N1 which are tied together. The source of the transistor N1 is tied to the common drain and gate electrodes of the transistor N2. The source of the transistor N2 is tied to the common drain and gate electrodes of the transistor N3. The source of the transistor N3 is coupled to the lead line 48 for generating the output voltage VPP. The oscillator 60 has a first output PUMPX on line 62 which is connected to one end of the capacitor $C_{B1}$ and a second output designated $\overline{PUMPX}$ on line 64 which is connected to one end of the capacitor $C_{B2}$. The other end of the capacitor $C_{B1}$ is tied to the common drain and gate electrodes of the transistor N3. The other end of the capacitor $C_{B2}$ is tied to the common drain and gate electrode of the transistor N2. The first output PUMPX provides positive going pulses and the second output $\overline{PUMPX}$ provides negative going pulses or inverted to those of the first output PUMPX. Typically, if the power supply voltage VCC is +5 volts, the output voltage VPP will be pumped up to a level of approximately +6 volts. In EPROM applications, the supply potential VCC is approximately +15 volts and the voltage VPP will be approximately +16 volts. In any event, the voltage VPP will always be approximately 1 volt higher than the supply potential VCC.

Figure 5:
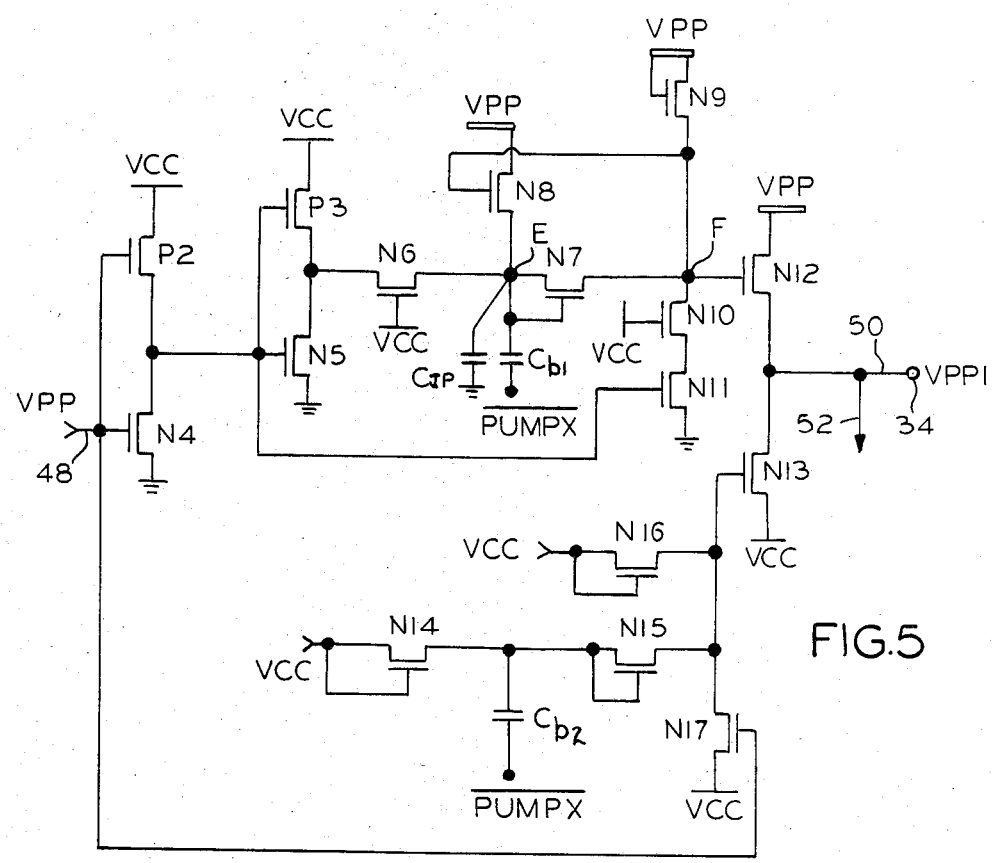
FIG. 5 is a schematic circuit diagram of the multiplier circuit of FIG. 3.

Referring now to the detailed schematic circuit diagram of FIG. 5, the multiplier circuit 40 includes a first inverter formed of a P-channel MOS transistor P2, and a N-channel MOS transistor N4 and a second inverter formed of a P-channel MOS transistor P3 and a N-channel MOS transistor N5. The gates of the transistors P2 and N4 are connected together and to the line 48 for receiving the output voltage VPP from the generator 38. The drains of the transistors P2 and N4 are also connected together and to the common gates of the transistors P3 and N5. The sources of the transistors P2 and P3 are tied to the supply potential VCC, and the sources of the transistors N4 and N5 are tied to a ground potential. The drains of the transistors P3 and N5 are tied together and to the drain of a pass transistor N6. The gate of the transistor N6 is tied to the supply potential VCC, and the source of the transistor N6 is connected to the common drain and gate electrodes of a charge transfer transistor N7. The drain of the transistor N7 is tied to one end of a pump capacitor $C_{b1}$ and to one end of a junction capacitor $C_{jp}$. The other end of the capacitor $C_{b1}$ is fed to the $\overline{PUMPX}$ output of the oscillator 60 on the line 64. The other end of the junction capacitor $C_{jp}$ is tied to the ground potential. The drain of the charge transfer transistor N7 is further tied to the source of a load transistor N8. The drain of the transistor N8 is tied to the higher output voltage VPP of the high voltage generator 38 on the line 48. The gate of the transistor N8 is connected to the source of a load transistor N9. The gate and drain electrodes of the transistor N9 are tied to the output voltage VPP. The sources of the transistors N7 and N9 are tied together and to the drain of a pass transistor N10. The gate of the transistor N10 is tied to the supply potential VCC. The source of the transistor N10 is connected to the drain of a switch transistor N11. The source of the transistor N11 is tied to the ground potential, and the gate of the transistor N11 is tied to the common drains of the transistors P2 and N4. The common sources of the transistors N7 and N9 are further tied to the gate of first output transistor N12. The drain of the transistor N12 is tied to the output voltage VPP and the source of the transistor N12 is tied to the source of a second output transistor N13. The drain of the transistor N13 is tied to the supply potential VCC.

The multiplier circuit further includes N-channel MOS transistor N14 having its drain and gate electrodes connected together and to the supply potential VCC. The source of the transistor N14 is connected to the drain and gate electrodes of a charge transfer transistor N15 and to one end of a capacitor $C_{b2}$. The other end of the capacitor $C_{b2}$ is fed from the $\overline{\text{PUMPX}}$ output of the oscillator 60 on the line 64. The source of the transistor N15 is coupled to the source electrodes of N-channel MOS transistors N16 and N17 and to the gate of the second output transistor N13. The drain and gate electrodes transistor N16 are also tied together and to the supply potential VCC. The drain of the transistor N17 is tied to the supply potential VCC and the gate of the transistor N17 is connected to the output voltage VPP. The common sources of the transistors N12 and N13 define the first higher voltage VPP1 on the line 50 which is connected to the first output terminal 34. The first high output voltage VPP1 is also supplied on the line 52 which is connected to the input of the delay network 42.

Referring now to FIG. 6, there is shown a detailed schematic circuit diagram of the delay network 42 and the level detector circuit 44. The delay network 44 receives the first higher voltage VPP1 on the line 52 which is fed into a first inverter formed of a P-channel MOS transistor P18 and a N-channel MOS transsitor N19. The gates of transistors P18 and N19 are connected together and to the line 52. The source of the transistor P18 is tied to the supply potential VCC, and the source of the transistor N19 is tied to the ground potential. The drains of the transistors P18 and N19 are connected together to form the output of the first inverter. The output of the first inverter is further connected to a second inverter formed of a P-channel MOS transistor P20 and a N-channel MOS transistor N21. The gates of the transistors P20 and N21 are tied together and to the output of the first inverter. A parasitic capacitance represented by capacitor C1 is connected between the output of the first inverter and ground potential. The source of the transistor P20 is tied to the supply potential VCC, and the source of the transistor N21 is tied to the ground potential. The drains of the transistors P20 and N21 are tied together to form the output of the second inverter. The output of the second inverter is connected to a RC network formed of a first resistor consisting of a transistor N22, a first capacitor C2, a second resistor consisting of a transistor N23, and a second capacitor C3. The drain of the transistor N22 is connected to the output of the second inverter, and the source of the transistor N22 is connected to one end of the capacitor C2 and to the drain of the transistor N23. The source of the transistor N23 is connected to one end of the capacitor C3. The gates of the transistors N22 and N23 are tied to the supply potential VCC. The other ends of the capacitors C2 and C3 are tied to the ground potential. The junction of the source of the transistor N23 and the capacitor C3 define the output of the delay network 42 which is on the line 56.

The level detection circuit 44 includes a pair of P-channel MOS transistors P24 and P25 whose sources are connected to the supply potential VCC. The drains of the transistors P24 and P25 are also connected together and to a series of N-channel MOS transistors formed of transistors N26, N27 and N28. The common drains of the transistors P24 and P25 are connected in particular to the drain of the transistor N26. The source of the transistor 26 is tied to the drain of the transistor N27, and the source of the transistor N27 is tied to the drain and gate electrodes of the transistor N28. The source of the transistor N28 is tied to the ground potential. The first input of the detector circuit 44 is at the gates of the transistors P25 and N26 which are tied together and to the junction of the resistor $R_L$ and the capacitor $C_X$ on the line 54. The second input of the detector circuit 44 is at the gates of the transistors P24 and N27 which are tied together and to the output of the delay network 42 on the line 56. The common drains of the transistors P24 and P25 define the output of the detector circuit 44 which is fed to the gate of the P-channel control transistor P1 via the line 58. The source of the control transistor P1 is also tied to the junction of the resistor $R_L$ and the capacitor $C_X$. The drain of the control transistor P1 is connected to one end of the load capacitor $C_L$ and to the second output terminal 36 at which is generated the second delayed and lower voltage VCCD.

The overall operation of the bias generator circuit 30 in FIG. 3 will now be explained with reference to the waveforms shown in FIGS. 7(a) through 7(d). Assume that a "power-up" sequence occurs where the high voltage generator 38 of the bias generator circuit receives a power supply voltage VCC at a time T1 which is illustrated in FIG. 7(a). This supply voltage VCC is approximately +5 volts. As a result, the output voltage of the multiplier circuit 40 will be pumped up to the supply voltage VCC at time T2 and will be further increased to the level of the first higher voltage VPP1 of approximately +6 volts at time T3 which is applied to the N-well region 16. This first higher output voltage VPP1 is shown in FIG. 7(b) and is also applied to the input of the delay network 42. The output of the delay network 42 is illustrated in FIG. 7(c) which shows how its output is charged up to approximately +4 volts between the time T2 and T3. Further, when the output of the delay network referred to as a delayed voltage reaches a predetermined level, the control signal at the output of the level detector circuit 44 will be switched from a "high" state (+5 volts) to a "low" state (0 volts) which is depicted in curve A of FIG. 7(d). This causes the control transistor P1 to turn on which allows the voltage at the junction of the resistor $R_L$ and the capacitor $C_X$, that has already been charged to the supply potential VCC, to pass through the conduction channel for charging up the load capacitor $C_L$. This voltage on the capacitor $C_L$ is the second delayed and lower voltage VCCD which is applied to the source region 12 of the P-channel transistor and is illustrated in curve B of FIG. 7(d). As can be seen, this second voltage VCCD is delayed and is lower in level relative to the first voltage VPP1 shown in FIG. 7(b). This is because the second voltage VCCD does not begin to charge up until after the first voltage VPP1 is already pumped up to the voltage which is higher than the supply potential VCC at the time T3. Consequently, the PN junction is always reversed bias, thereby preventing the possibility of CMOS latch-up.

Figure 8:
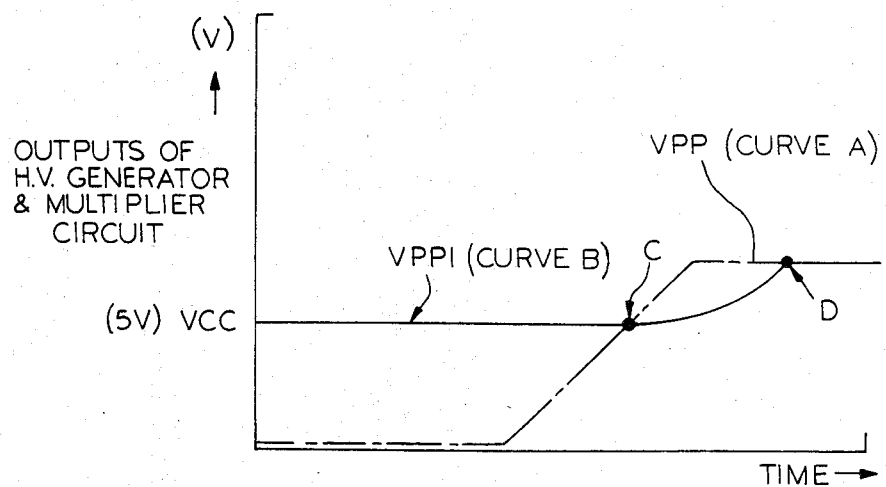
Figure 9:
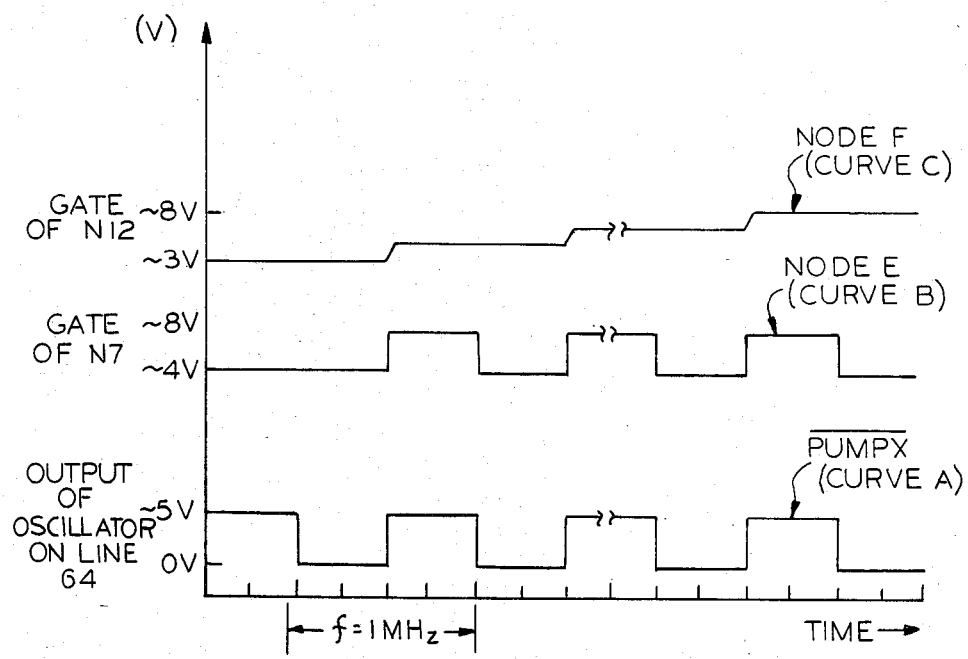

For a better understanding of the operation of the high voltage generator 38 and the multiplier circuit 40, reference is now made to the waveform diagrams in FIG. 8 and 9. In response to receiving the supply voltage VCC on its input via the line 46, the output of the generator 38 will be pumped up to the voltage VPP which is illustrated in curve A of FIG. 8. This voltage VPP will reach approximately +6 volts when the supply potential VCC is +5 volts. The voltage VPP is applied to the input of the multiplier circuit 40 so as to generate the first higher voltage VPP1 which is depicted in curve B of FIG. 8. As can be seen, for all times prior to the crossover point C of the curves A and B, the first higher voltage VPP1 will be equal to the supply potential VCC even in the absence of the output voltage VPP such as due to a failure of the oscillator. This can be best explained by looking at the detailed schematic circuit of FIG. 5. When the voltage VPP is less than the supply voltage VCC, the P-channel transistor P2 will be turned on and its output at the drain will be at the supply potential VCC which, in turn, turns on the N-channel transistor N11. Since the gate of the transistor N10 is tied to the supply transistor VCC, it will always be turned on. Thus, node F or the gate of the transistor N12 will be grounded through the transistors N10 and N11 so as to cause turning off of the transistor N12. Also, the transistor N17 will be turned on once the voltage VPP exceeds the threshold voltage of the transistor N17. Then, the supply potential VCC will be applied to the gate of the transistor N13 causing the same to be rendered conductive. As a result, the supply potential VCC on the drain of the transistor N13 will be passed through the conductive channel which makes the first output voltage VPP1 equal to the supply potential VCC.

For all times subsequent to the crossover point C, the voltage VPP1 will be pumping up to the voltage VPP and will reach the same level at a point D. Since the voltage VPP is now higher than the supply potential VCC, the transistor N4 will be turned on causing the transistor P3 to turn on and turns off the transistor N5. As a result, the transistor N11 will be turned off and the transistor N6 will be turned on. This permits the PUMPX output on line 64 of the oscillator (curve A of FIG. 9) to pump up the voltage on the node E which is then transferred to the node F via the charge transfer transistor N7. Typically, the frequency of the oscillator 60 is one MHz. The outputs of the nodes E and F are illustrated in respective curves B and C of FIG. 9. When the voltage at the node F exceeds the sum of the threshold voltage of the transistor N12 and the supply potential VCC, the transistor N12 will be rendered conductive and the output VPP will be passed through the conductive channel to now define a new higher voltage VPP1. Further, since the gate of the transistor N13 will be lower than this new higher voltage VPP1, it will be turned off.

This generator circuit of the present invention has the following advantages over the prior art designs:

(a) other circuits on the same semiconductor chip do not require as many as guard-rings and may be fabricated with close spacings;
(b) it increases the latch-up immunity and also increases the design layout density on an integrated substrate; and
(c) the N-well region is biased by a first voltage higher than a supply potential VCC which occurs prior to the application of a second lower voltage applied to the source region.

From the foregoing detailed description, it can thus be seen that the present invention provides a bias generator circuit which provides a first high voltage for biasing a N-well region and a second delayed and lower voltage for biasing a source region of a P-channel field-effect transistor so as to increase latch-up immunity. The bias generator circuit is formed of a high voltage generator, a multiplier circuit, a delayed network, a level detector circuit and a control transistor. It should be understood by those skilled in the art that all of the circuit components for the bias generator circuit of the present invention may be formed on a single silicon chip of a semiconductor integrated circuit.

While there has been illustrated and described what is at present to be considered a preferred embodiment of the present invention, it will be understood by those skilled in the art that various changes and modifications may be made and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out this invention, but that the invention will include all embodiments falling within the scope of the appended claims.

What is claimed is:

1. A bias generator circuit which produces a first higher voltage for biasing a N-well region and a second delayed and lower voltage for biasing a source region of a P-channel field-effect transistor formed within the N-well region so as to increase latch-up immunity, said generator circuit comprising:

means for generating a power supply voltage:

high voltage means responsive to said power supply voltage for generating a first voltage level for biasing the N-well region;

delay means responsive to said first voltage level for generating a delayed voltage;

level detector means responsive to said delayed voltage and said power supply voltage for generating a control signal when said delay voltage reaches a predetermined level; and control means responsive to said control signal for generating a second voltage level for biasing the source region of the P-channel field-effect transistor, said second voltage level being delayed and lower than said first voltage level so that the source region and the N-well region defining a PN junction is reverse biased to increase latch-up immunity.

2. A bias generator circuit as claimed in claim 1, wherein said high voltage means comprises a high voltage generator and a multiplier circuit which pumps the power supply voltage to the first voltage level, said multiplier circuit being coupled to an output voltage of said high voltage generator.

3. A bias generator circuit as claimed in claim 2, wherein said multiplier circuit includes means for maintaining the first voltage level to be equal to the power supply voltage when said output voltage of said high voltage generator is lower than said power supply voltage and means for increasing the first voltage level to be equal to said output voltage of said high voltage generator when said output voltage is higher than said power supply voltage.

4. A bias generator circuit as claimed in claim 1, wherein said delay means comprises a pair of first and second inverters and a RC network.

5. A bias generator circuit as claimed in claim 4, wherein each of said inverters is formed of a P-channel MOS transistor and a N-channel MOS transistor.

6. A bias generator circuit as claimed in claim 4, wherein said RC network is formed of a pair of N-channel MOS transistors and a pair of capacitors.

7. A bias generator circuit as claimed in claim 1, wherein said level detector means comprises a pair of P-channel MOS transistors and a series connection of three N-channel MOS transistors.

8. A bias generator circuit as claimed in claim 1, wherein said control means includes a P-channel MOS transistor whose gate electrode is responsive to said control signal for generating said second voltage level to said source region only after said first higher voltage level has been already applied to the N-well region.

9. A bias generator circuit as claimed in claim 2, wherein said multiplier circuit comprises a pair of first and second N-channel MOS output transistors having their sources connected together and to a first output terminal for supplying the first voltage level, the drain of said first transistor being connected to the output voltage of the high voltage generator, the drain of the second transistor being connected to the power supply voltage, the gate of the first transistor being coupled to receive a first pumped voltage, the gate of the second transistor being coupled to receive a second pumped voltage.

10. A bias generator circuit as claimed in claim 9, further comprising a first charge transfer transistor for generating the first pumped voltage and second charge transfer transistor for generating the second pumped voltage.

11. A field-effect integrated circuit which is responsive to a first higher voltage for biasing a well-region and a second delayed and lower voltage for biasing a source region of a field-effect transistor comprising:
a semiconductor substrate of a first conductivity type having at least one well-region of a second conductivity type embedded in said substrate, two regions of said first conductivity type being embedded within said at least one well-region for forming the source and drain regions of the transistor of said first conductivity type, one region of said second conductivity type also being embedded within said at least one well-region of said second conductivity type;
means formed of a high voltage generator and a multiplier circuit for generating and applying a first bias voltage to said at least one well-region of said second conductivity type; and
means responsive to said first bias voltage for generating and applying a second bias voltage to said source region of said first transistor of said first conductivity type, said second bias voltage being delayed and lower in level than said first bias voltage so as to increase latch-up immunity.

12. A field-effect integrated circuit as claimed in claim 11, wherein said first conductivity type is P-conductivity type and said second conductivity type is a N-conductivity type.

13. A field-effect integrated circuit as claimed in claim 11, wherein said means for generating and applying said second bias voltage includes a delay network, a level detector circuit, and a control device.

14. An integrated circuit comprising:
a substrate of a first conductivity type;
a well-region of a second conductivity type being embedded within said substrate;
two regions of said first conductivity type being embedded within said well-region for forming the source region and drain region of a transistor of said first conductivity type;
a region of said second conductivity type being also embedded within said well-region, said well-region being in physical contact with said source region for forming a PN junction;
means for applying a first voltage level to said well-region and for applying a second level to said source region, said second voltage being delayed and having a lower voltage level relative to said first voltage level to maintain said PN junction in a reverse biased condition so as to increase latch-up immunity;
said means for applying said first and second voltage levels including a high voltage generator, a multiplier circuit, a delay network and a level detection circuit; and
control means having a conduction path coupled between a power supply voltage and said source region and a control electrode responsive to said first voltage level for controlling the conductivity across said conduction path, said control means applying said second voltage level to said source region only after the first higher voltage level has already been applied to the well-region.

15. An integrated circuit as claimed in claim 14, wherein said first conductivity type is a P-conductivity type and said second conductivity type is a N-conductivity type.

16. An integrated circuit as claimed in claim 14, wherein said control means includes a P-channel MOS transistor.

17. A bias generator circuit as claimed in claim 1, wherein said generator circuit is formed on a single silicon chip of a semiconductor integrated circuit.

* * * * *